(12) United States Patent
Liberini et al.

(10) Patent No.: US 10,151,775 B2
(45) Date of Patent: Dec. 11, 2018

(54) HIGH-PLANARITY PROBE CARD FOR A TESTING APPARATUS FOR ELECTRONIC DEVICES

(71) Applicant: Technoprobe S.p.A., Cernusco Lombardone (IT)

(72) Inventors: Riccardo Liberini, Cernusco Lombardone (IT); Filippo Dell'Orto, Cernusco Lombardone (IT); Roberto Crippa, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 0 days.

(21) Appl. No.: 15/257,424

(22) Filed: Sep. 6, 2016

(65) Prior Publication Data

US 2016/0377655 A1  Dec. 29, 2016

Related U.S. Application Data

(63) Continuation-in-part of application No. PCT/IB2015/051605, filed on Mar. 5, 2015.

(30) Foreign Application Priority Data

Mar. 6, 2014 (IT) .............................. MI2014A0349

(51) Int. Cl.
*G01R 1/073* (2006.01)
(52) U.S. Cl.
CPC ..... *G01R 1/07314* (2013.01); *G01R 1/07378* (2013.01)

(58) Field of Classification Search
None
See application file for complete search history.

(56) References Cited

U.S. PATENT DOCUMENTS

| | | |
|---|---|---|
| 7,285,968 B2 | 10/2007 | Eldridge et al. |
| 2002/0109514 A1 | 8/2002 | Brandorff et al. |
| 2003/0080764 A1 | 5/2003 | Zhou et al. |
| 2008/0157790 A1 | 7/2008 | Hobbs et al. |
| 2010/0001748 A1 | 1/2010 | Sasaki et al. |
| 2010/0019788 A1 | 1/2010 | Boehm et al. |
| 2010/0207652 A1 | 8/2010 | Chung et al. |
| 2016/0377656 A1* | 12/2016 | Liberini ............. G01R 1/07378 324/756.03 |

* cited by examiner

*Primary Examiner* — Jermele M Hollington
(74) *Attorney, Agent, or Firm* — Seed IP Law Group LLP

(57) ABSTRACT

A probe card for a testing apparatus of electronic devices comprises at least one testing head which houses a plurality of contact probes, each contact probe having at least one contact tip suitable to abut onto contact pads of a device under test, and a support plate of the testing head associated with a stiffener and an intermediate support, connected to the support plate and suitable to provide a spatial transformation of the distances between contact pads made on the opposite sides thereof. Conveniently, the probe card comprises a support element which is joined to the intermediate support, this support element being made by means of a material having a greater stiffness than the intermediate support, thereby being able to provide local micro rectifications of the intermediate support.

14 Claims, 3 Drawing Sheets

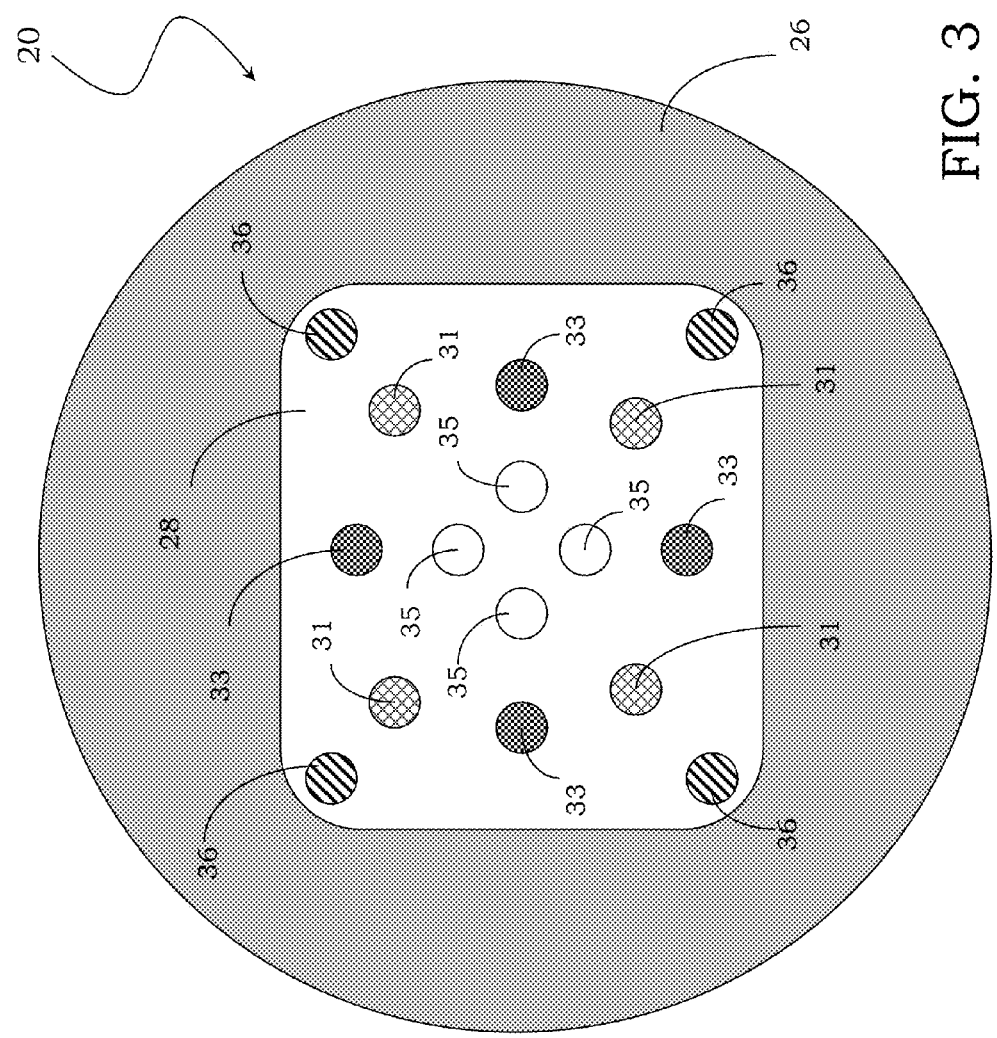

HIGH-PLANARITY PROBE CARD FOR A TESTING APPARATUS FOR ELECTRONIC DEVICES

BACKGROUND

Technical Field

The present invention relates to a probe card for a testing apparatus of electronic devices.

The invention relates to, particularly, though not exclusively, a high-planarity probe card and the following description has been made with reference to this field of application with the only purpose of simplifying the presentation.

Discussion of the Related Art

As it is well known, a probe card is a device suitable for placing a plurality of contact pads of a microstructure, particularly an electronic device integrated on a wafer, into electrical contact with corresponding channels of a testing apparatus performing the working test thereof, particularly an electrical test.

The test, which is carried out on integrated circuits, is particularly used for detecting and isolating defective devices already in the manufacturing phase. Generally, probe cards are used for electrically testing integrated circuits on wafers before cutting (singling) and mounting them inside a chip package.

A probe card comprises a testing head including, in turn, a plurality of movable contact elements or contact probes, which are provided with at least one portion or contact tip for a corresponding plurality of contact pads of a device under test. With the terms end or tip is meant herein and below an end portion, which is not necessarily pointed.

Therefore, the effectiveness and reliability of a measuring test, among other factors, is known to depend also on the creation of a good electrical connection between a device and a testing apparatus, and therefore on the establishment of an optimal probe/pad electrical contact.

Among the types of testing heads used in the technical sector considered herein for the integrated circuit testing, the so-called testing heads with cantilever probes are widely used, which have probes protruding like a fishing rod over a device under test and are also called cantilever testing heads.

Particularly, a cantilever testing head of a known type usually supports a plurality of flexible, in general threadlike, probes with preset electrical and mechanical properties. The probes, cantilevered from the cantilever testing head, have a substantially hooked shape, for the presence of an ending segment substantially elbow-folded having a generally obtuse internal angle.

The good connection between probes of a cantilever testing head and contact pads of a device under test is ensured by pushing the testing head on the device itself, the probes undergoing thereupon a vertical bending (relative to the plane defined by the device under test) in an opposite direction to the movement of the device towards the testing head.

The hooked shape of the probes is such that the probe contact tips, during the contact with the contact pads of the device under test and during the probes excursion upwardly beyond a preset contact point usually called "overtravel", slide on the contact pads over a length usually called "scrub".

Testing heads with vertical probes, which are designated as "vertical probe heads", are also known in the art. A vertical probe head comprises a plurality of contact probes held by at least one pair of plates or dies, which are substantially plate-shaped and parallel to each other. These dies are provided with specific holes and are arranged at a certain distance from each other such as to leave a free area or air gap for the movement and possible deformation of the contact probes. The pair of dies particularly comprises an upper die and a lower die, both being provided with guiding holes in which the contact probes, generally formed by special alloy wires having good electrical and mechanical properties, slide axially.

Also in this case, the good connection between the testing probes and contact pads of the device under test is ensured by pressing the testing head on the device itself, with the contact probes movable within the guiding holes provided in the upper and lower dies being caused to bend within the air gap between the two dies, and to slide within these guiding holes upon this pressing contact.

Moreover, the bending of the contact probes within the air gap can be facilitated by a suitable configuration of the probes themselves or the dies thereof, particularly by either using contact pre-shaped probes or conveniently horizontally shifting the plates comprising them.

Testing heads are generally used, which have probes that are not fixedly fastened but hold interfaced to a card, which is connected in turn to the testing apparatus: these are called testing heads with unlocked probes.

In this case, the contact probes also have an end or contact head towards a plurality of contact pads of that card. The good electrical contact between the probes and the card is secured similarly to the contact with the device under test by pressing the probes onto the card contact pads.

Moreover, the card is generally held in position by means of a stiffener. The assembly of testing head, card and stiffener forms a probe card, which generally and schematically designated with 10 in FIG. 1.

Particularly, the probe card 10 comprises a testing head 1, which in the example of the figure is a vertical probe head. In this case, such a testing head 1 comprises, in turn, at least one upper plate or die 2 and a lower plate or die 3, having respective upper and lower guiding holes inside which a plurality of contact probes 4 slide.

Each contact probe 4 has at least one end or contact tip abutting onto a contact pad of a device under test 5, thereby providing the mechanical and electrical contact between said device and a testing apparatus (not illustrated) of which this testing head 1 forms a terminal element.

Moreover, each contact probe 4 has a further contact tip, which is designated as the contact head in practice, towards a plurality of contact pads of the card 6. The good electrical contact between the probes and the card is ensured similarly to the contact with the device under test by pushing the probes onto the contact pads of the card 6.

As stated above, the card 6 is held in position by means of a stiffener 8.

In the vertical probe technology, it is thus also important to ensure a good connection between the contact probes and the testing apparatus, particularly at contact heads thereof, and accordingly at the card.

Several technologies are known to make the probe card 10 of the testing apparatus.

Particularly, a first solution provides using printed circuit boards techniques to make the card 10, which is usually also designated with PCB (acronym for: "Printed Circuit Board"). This technology allows making cards having active areas that may even be large-sized, but have huge limitations relative to a minimum pitch value that can be achieved between the contact pads on the device under test.

The ceramic base technology or MLC (acronym for "Multi-Layer Ceramic") is also known. Such a technology allows obtaining very fine pitches and higher densities as compared with PCB technology, however it has limitations on the maximum number of signals that can be used for the test and on the maximum dimension of the active area that can be placed on the card.

In the MLC technology, plates can be made of rigid ceramic material with a high planarity grade. These plates are not subjected to deformations or locally applied forces, which would only risk breaking them, but they can be provided with a central screw acting as a pivot and lateral adjustment screws associated with counter springs to allow a tilting of the plane defined by the plate itself.

Finally, a so-called hybrid technology can be used, where the testing head is interfaced to an intermediate plate, usually designated as interposer. This technology offers great flexibility in terms of surface, pitch and signal density, but is limited in the maximum number of manageable signals, having worst electromagnetic performances as well. A non-negligible disadvantage of the hybrid technology is that it is difficult to automatize.

US patent application published under No. US 2008/0157790 discloses a stiffener assembly, comprising an outer and inner member, to be coupled to an intermediate plate, wherein a plurality of alignment mechanisms allows the regulation of the inner member with respect to the outer member and allows a planar and/or lateral orientation of the probe head. The inner member is made of a material so as to ensure the rigidity of the probe card.

It should be understood that the thickness of the intermediate plate (interposer) is generally very low, ranging between 0.5 and 3 mm and therefore such plate has significant planarity problems. By being associated with the stiffener, it makes the whole assembly more rigid and resistant and allows a partial reduction in the defects of planarity in the intermediate plate, which however often result to affect the good operation of the cards made with this technology.

BRIEF SUMMARY

An embodiment of the present invention is directed to a probe card, which is suitable to support a testing head provided with a plurality of contact probes for connection with an electronic device testing apparatus, particularly integrated on a wafer, having such structural and functional characteristics as to allow overcoming the limitations and drawbacks currently experienced with the probe cards made with known technologies, particularly allowing to guarantee a proper planarity of the assembly of card components.

A support element is joined with an intermediate plate or interposer realized with PCB technology, in such a way as to provide local micro rectifications of the interposer itself, thereby improving the planarity thereof, the assembly of the support element and the interposer also being rigid enough to guarantee a proper contact of the contact probes during electronic devices testing. Particularly, this support element is provided by means of a metal plug having greater stiffness and planarity than the interposer.

According to an embodiment of the invention, a probe card for an electronic devices testing apparatus is provided, the probe card comprising at least one testing head which houses a plurality of contact probes, each contact probe having at least one contact tip suitable to abut onto contact pads of a device under test, and a support plate of said testing head associated with a stiffener and an intermediate support, connected to said support plate and suitable to provide a spatial transformation of the distances between contact pads made on its opposite sides. The probe card suitably comprises a support element being joined with said intermediate support, said support element being realized by means of a material having a stiffness greater than said intermediate support, thereby being able to realize local micro-rectifications of said intermediate support.

More particularly, some embodiments of the invention comprise the following additional and optional features, taken individually or in combination.

According to an embodiment of the invention, the support element can be glued to the intermediate support.

This support element can be joined with the intermediate support by means of interlocking means, hooking means, or by means of screws.

According to another embodiment of the invention, the support element can be a metal plug.

Particularly, this support element can be made of a nickel-iron alloy.

According to another embodiment of the invention, the probe card can further comprise a regulation system, suitable to associate the stiffener with the support element and able to apply local forces to the support element by pushing and/or pulling this support element with respect to the stiffener, these local forces being transmitted to the intermediate support joined with the support element.

Particularly, this regulation system can comprise a plurality of adjustment screws distributed on a plane of the support element and housed in respective seats formed in this stiffener.

Furthermore, this regulation system can comprise first adjustment screws housed within first seats formed in the stiffener in such a way that each first adjustment screw has a body housed in this support element and a head having at least one undercut plane resting on the support element and a flat plane, opposite to the undercut plane, accessible through a respective first seat for the adjustment of this first screw, the first adjustment screws acting by pushing the support element.

This regulation system can further comprise second adjustment screws housed in second seats formed in the stiffener in such a way that each second adjustment screw has a body housed in this support element and a head having at least one undercut plane resting on the stiffener and a flat plane, opposite to the undercut plane, accessible through a respective second seat for the adjustment of this second screw, the second adjustment screws acting by pulling the support element in contrast with a pushing onto the stiffener.

These adjustment screws can have a shape with a substantially T-like section.

Particularly, these adjustment screws can be force-multiplying screws.

In addition, these adjustment screws can be generic screws, screw studs associated with nuts making the heads thereof, bolts or hooking systems.

According to another embodiment of the invention, these adjustment screws can substantially have equal dimensions.

These adjustment screws can also be realized by means of substantially tubular elements and can have a body having a diameter between 2 mm and 4 mm and a head having a diameter between 4 mm and 7 mm, these values being intended under normal operating conditions for the probe card, i.e. in the absence of mechanical stresses and/or thermal expansion of the same.

Particularly, the seats of the adjustment screws can be realized by means of substantially tubular elements and can comprise at least one housing compartment having a conjugated and complementary shape with respect to the adjustment screw heads and an elongate passage.

This elongate passage of the first seats can particularly allow a connection with the outside flat plane of the heads of the first adjustment screws.

Furthermore, this elongate passage of the second seats can allow a passage of the body of the second adjustment screws until it reaches the support element.

According to another embodiment of the invention, the housing compartments of the seats can be formed having increased dimensions relative to the dimensions of the adjustment screws heads, in such a way as to allow the heads to be loosely accommodated therein.

Particularly, according to yet another embodiment of the invention, the regulation system can comprise an alternate succession of first adjustment screws operating by pushing and of second adjustment screws operating by pulling, distributed all along the plane of the support element.

According to a further embodiment of the invention, the regulation system can also further comprise support screws positioned substantially in the center and at the corners of the support element and used to suitably tilt this support element.

Finally, according to yet another embodiment of the invention, the probe card can further comprise pressing elements associated with the intermediate support and suitable to apply a suitable pressure on the same.

The characteristics and advantages of the probe card according to the invention will result from the here below description of one of the embodiments thereof given as a non-limiting example with reference to the attached drawings.

BRIEF DESCRIPTION OF THE SEVERAL VIEWS OF THE DRAWINGS

FIG. 3 schematically shows a bottom view of the probe card of FIG. 2.

DETAILED DESCRIPTION

Figure 1:
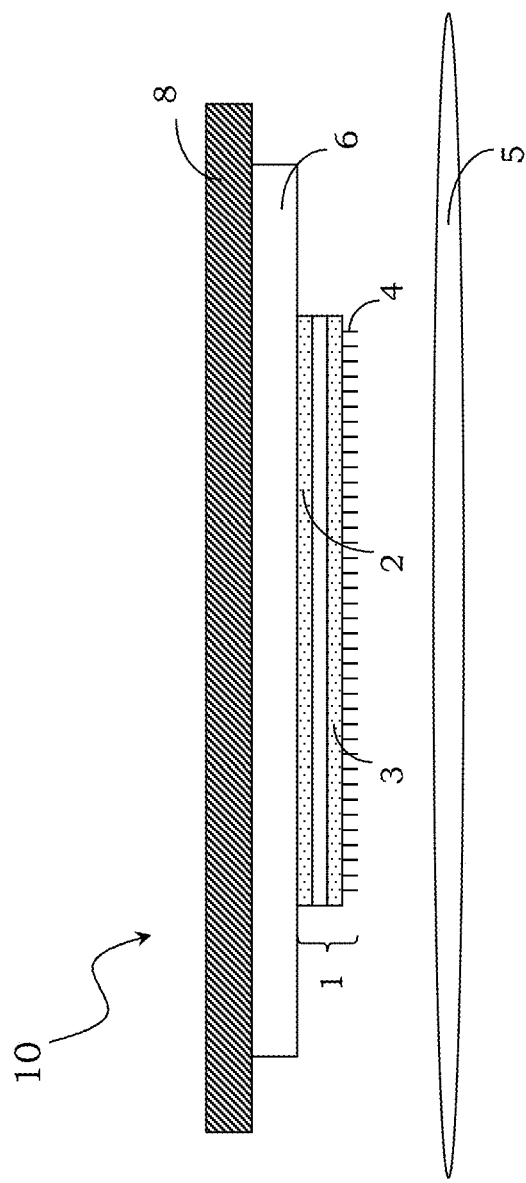
FIG. 1 schematically shows a probe card suitable to support a vertical probe testing head made according to the prior art.
Figure 2:
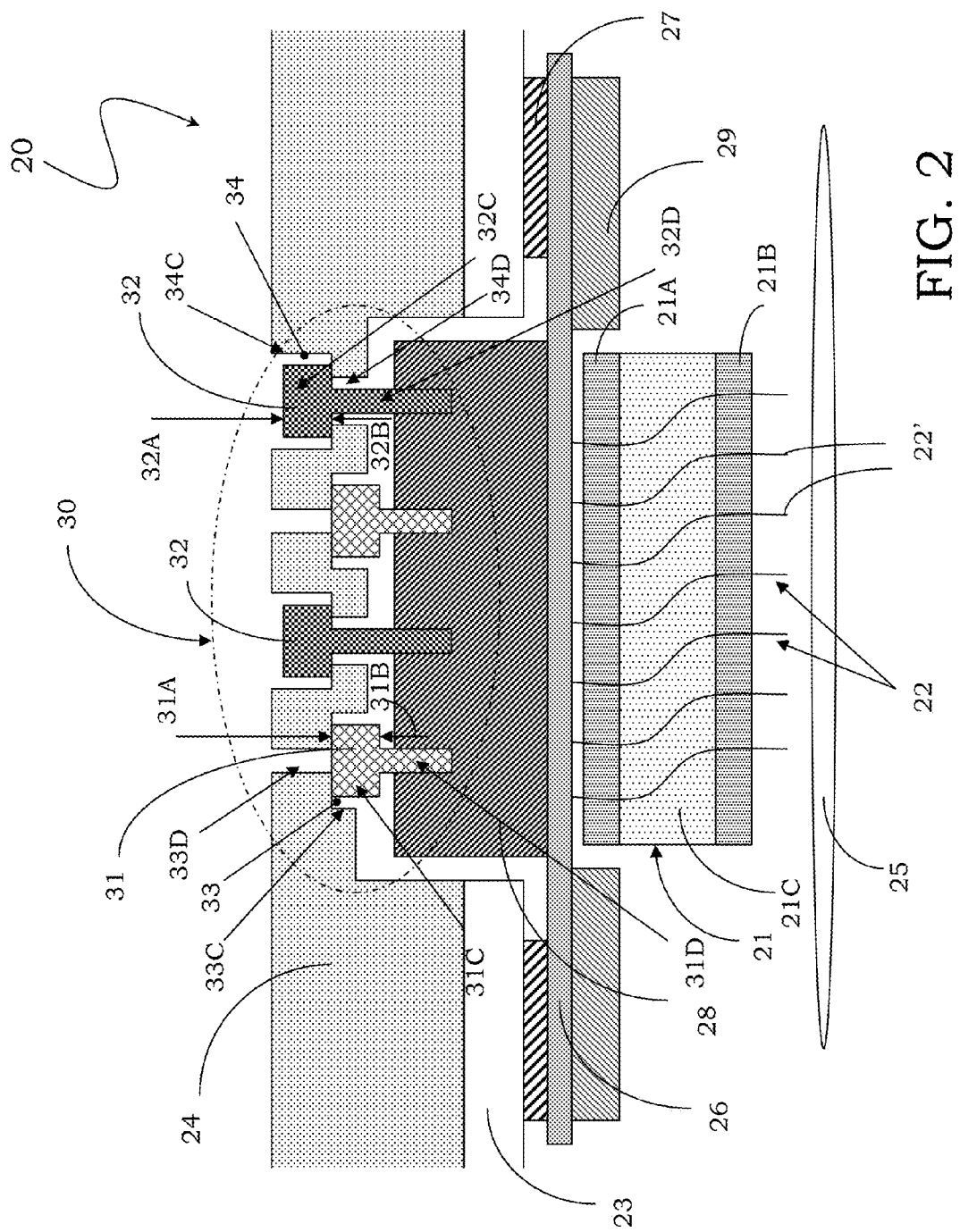
FIG. 2 schematically shows a sectional view of a probe card according to an embodiment of the invention.

With reference to such figures, and particularly to FIG. 2, a probe card comprising at least one testing head provided with a plurality of contact probes for testing electronic devices, particularly integrated on a wafer, is generally indicated with 20.

It should be noted that the figures represent schematic views of the card according to embodiments of the invention and are not drawn to scale, on the contrary they are drawn such as to highlight the important characteristics of the invention.

Moreover, the various embodiments of the invention represented by way of example in the figures can be clearly combined with each other and interchangeable between one embodiment and another.

Particularly, as illustrated in FIG. 2, the probe card 20 comprises a testing head 21, which houses a plurality of contact probes 22, and a support plate 23, usually indicated as PCB, and a stiffener 24.

The probe card 20 is suitable to connect with a testing apparatus (not shown). Particularly, in the example illustrated in the figure, by way of example only, the testing head 21 is of a vertical type and comprises at least one upper plate or die 21A and a lower plate or die 21B, having respective holes within which the contact probes 22 slide. The testing head 21 also comprises a containment element 21C of the probes, arranged between the upper 21A and lower 21B dies.

In any case, the contact probes 22 comprise ends or contact tips 22' suitable to abut onto corresponding contact pads of a device under test 25, so as to realize the desired contact, particularly electrical contact, between the same and the probe card 20, and then the testing apparatus connected thereto.

The probe card 20 also comprises an intermediate support or interposer 26, associated with the support plate 23 by means of a suitable connector 27.

It should be understood that the intermediate support or interposer 26 is suitable to provide a spatial transformation of the distances between the contact pads formed on the opposite sides thereof. Particularly, the interposer 26 can comprise a first plurality of contact pads formed on one of the first side thereof facing the testing head 21 and having a similar density or pitch, particularly equal to the one of the contact pads of the device under test 25, and a second plurality of contact pads made on a second and opposite side and connected to the support plate 23, which is a printed circuit board or PCB. More particularly, the second plurality of contact pads has a lower density with respect to the first plurality of contact pads, within the interposer 26 being provided suitable electrical connections to realize the addressing between the first plurality and the second plurality of contact pads.

It is also possible use a testing head of a micromechanical type like the so-called micro cantilever, having probes directly soldered to the interposer 26, the disclosure not being limited to one particular type of testing head.

Advantageously according to an embodiment of the invention, the probe card 20 also comprises a support element 28, having greater stiffness than the interposer 26 and being solidarized or joined with the interposer 26. Particularly, the support element 28 is made by means of a metal plug. This metal plug has a greater stiffness than the interposer 26, which is made of materials compatible with the PCB technologies, preferably by means of the Multi-Layer Organic (MLO) technology. Moreover, normal metal processing technologies allow realizing high-planarity metal elements, particularly in any case greater than the planarity obtainable by the interposer 26 using the PCB technologies.

It should be understood that by joining the support element 28 with the interposer 26, local micro-rectifications of the interposer can be provided, thereby improving the planarity thereof, the assembly of the support element and the interposer being also rigid enough to ensure a proper contact of the contact probes upon testing electronic devices and to avoid the so-called "bowing" of the interposer 26 when it comes into pressing contact against the contact probes 22 of the testing head 21 under usual testing conditions.

Particularly, due to the presence of the support element 28, the interposer 26 is able to support loads of tens of Kg, such as those caused by the pushing contact with the contact probes 22 of the testing head 21, without bowing and thus compromising the contact with the probes themselves during the test.

More particularly, this support element 28 is preferably glued to the interposer 26. Alternatively, it is possible to join the support element 28 and the interposer 26 by means of interlocking means, hooking means, or by means of screws.

The metal support element 28 is preferably made of a nickel-iron alloy, for example stainless steel, particularly having a high nickel content, or alloys known as alloy 42, Nilo® 42, ivar 42 or NiFe 42, to name few.

Furthermore, the probe card 20 comprises pressing elements 29 associated with the interposer 26 and suitable to apply over it a suitable pressure, particularly in the opposite direction with respect to the support element 28.

Advantageously according to an embodiment of the invention, the probe card 20 also comprises at least one regulation system 30, suitable to associate the stiffener 24 with the support element 28 and able to apply to this support element 28, and, consequently, to the interposer 26 being joined thereto, local forces pushing and/or pulling the support element 28 with respect to the stiffener 24.

The regulation system 30 comprises a plurality of adjustment screws 31, 32 distributed on a plane of this support element 28 and housed in respective seats 33, 34 formed in this stiffener 24.

More particularly, the regulation system 30 comprises first adjustment screws 31 housed in first seats 33 realized in the stiffener 24 in such a way that each first adjustment screw 31 has a body 31D housed in the support element 28 and a head 31C having at least one undercut plane 31B resting on the support element 28 and an external plane 31A, opposite to the undercut plane 31B, accessible through the respective first seat 33 exactly for the adjustment of the first screw. Thereby, the first adjustment screws 31 act pushing the support element 28.

Furthermore, the regulation system 30 comprises second adjustment screws 32 housed in second seats 34 realized in the stiffener 24 in such a way that each second adjustment screw 32 has a body 32D housed in the support element 28 and a head 32C having at least one undercut plane 32B resting on the stiffener 24 and an external plane 32A, opposite to the undercut plane 32B, accessible through the respective second seat 34 for the adjustment of the second screw. In this way, the second adjustment screws 32 act pulling the support element 28 in contrast with the pushing onto the stiffener 24.

Substantially, the adjustment screws 31, 32 have a shape with a substantially T-like section.

Particularly, force-multiplying screws are used as adjustment screws 31, 32, which are able to apply local forces and thus small deformations of the support element 28, usually realized by means of a metal block having a reduced thickness.

The regulation system 30 exploits the elasticity of the adjustment screws 31, 32 contrasting the stiffness of the stiffener 24.

More particularly, it is possible to use, generic screws, screw studs associated with nuts making the heads thereof, bolts or hooking systems, to name few.

It is possible to provide similar dimensions for the first and second adjustment screws 31, 32 and, in case of substantially tubular elements, it is possible to consider that each adjustment screw 31, 32 comprises a body 31D, 32D having a diameter between 2 mm and 4 mm and a head 31C, 32C having a diameter between 4 mm and 7 mm, these values being intended under normal operating conditions for the probe card 20, i.e. in the absence of mechanical stresses and/or thermal expansion of the same.

It is also possible to provide substantially equal dimensions for the first and second seats 33, 34 of the adjustment screws 31, 32 and, in case of substantially tubular elements, it is possible to consider that each seat 33, 34 comprises at least one housing compartment 33C, 34C, respectively, having a conjugated and complementary shape with respect to the heads 31C, 32C of the adjustment screws 31, 32 and a elongate passage 33D, 34D, respectively. More particularly, for the first seats 33 of the first adjustment screws 31, the elongate passage 33D allows the connection with the outside of the external plane 31A of the head 31C of the first adjustment screws 31 and therefore their adjustment. For the second adjustment screws 32, which have an external plane 32A already surfacing from the stiffener 24 and thus reachable for the adjustment, the elongate passage 34D allows the passage of the body 32D until it reaches the support element 28.

Advantageously, the housing compartments 33C, 34C, for the heads 31C, 32C of the adjustment screws 31, 32 are formed having greater dimensions, for example at least in an amount of 5%, with respect to the dimensions of the heads 31C, 32C, in such way allowing a housing of the heads 31C, 32C having clearance and therefore allowing their movement during the adjustment performed by the regulation system 30.

Furthermore, the increased dimensions of the housing compartments 33C, 34C of the seats 33, 34 relatively to the heads 31C, 32C of the adjustment screws 31, 32 also allows expanding the interposer 26, and the support element 28 to which it is connected, following an increase in the operating temperature of the probe card 20, at the same time avoiding any movement of the testing head 21, which would invalidate the good outcome of the test performed using it.

As said before, each adjustment screw 31, 32 applies a push and/or a pull to the metal structure of the support element 28, the corresponding local force thus being transmitted to the interposer 26.

Thereby, the regulation system 30 is capable to apply local micro adjustments to the interposer 26 through the support element 28.

Therefore, the regulation system 30 can be used to further locally planarize the interposer 26 being joined to the support element 28. The need for this planarization is particularly felt in case of very thin interposers 26, for example having a thickness between 0.5 and 3 mm, and thus very flexible.

More particularly, as schematically illustrated in FIG. 3, the regulation system 30 comprises an alternating succession of first adjustment screws 31 active by pushing and second adjustment screws 32 active by pulling, distributed all along the support element 28. As said, the adjustment screws 31, 32 are screw studs allowing the application of local forces that warp the interposer 26 point to point; particularly, the support element 28 is elastically warped and the force is transmitted to the interposer 26.

The regulation system 30 also comprises support screws 35, 36, namely first support screws 35 positioned substantially in the center of the support element 28 and second support screws 36 positioned at the corners of the support element 28 which has a substantially parallelepiped shape.

Particularly, the support screws 35, 36 are used to suitably tilt the support element 28, and thus the interposer 26 being joined thereto.

In a preferred embodiment, the first adjustment screws 31 and the second adjustment screws 32 are distributed evenly and in an alternated manner in the portion of the support element 28 free of support screws 35, 36. Such even distribution effectively ensures a good pushing or pulling load distribution when adjusting by means of screwing screws.

Each adjustment and support screw can also be provided with a spacer element (not illustrated) such as small squares or washers, conveniently drilled to allow the passage of the screws themselves and suitable to relieve the local load applied by the screws on the support element 28 or stiffener 24.

The combined action of the adjustment screws 31, 32 and the support screws 35, 36 of the regulation system 30 thus allows obtaining the desired planarization and tilting effects of the support element 28 and thus of the interposer 26 being joined thereto.

It should be understood that the probe card 20 is in contact with pressing elements 29 of the testing apparatus (not illustrated) suitable to push the interposer 26 in the portion not in contact with the support element 28, thus increasing the overall planarity thereof.

In conclusion, advantageously according to the embodiments of the invention, a high-planarity probe card is obtained due to the presence of the support element being joined to the intermediate plate or interposer in such a way as to realize local micro-rectifications of the interposer itself, improving its planarity.

Particularly, the support element is rigid enough to guarantee a proper contact of the contact probes during testing of electronic devices. The support element is realized by means of a metal plug having a greater stiffness and planarity than the interposer.

Such a probe card thus results able to operate properly even against a pushing contact with the contact probes 22 of the testing head 21, which during normal testing operations are able to apply loads up to tens of Kg, the assembly of support element being joined with the interposer that does not risk bowing and thus compromising the contact with the probes themselves.

Furthermore, the probe card according to the embodiments of the invention has the possibility of further locally adjusting the interposer planarity, particularly useful in case of interposer having a reduced thickness.

This adjustment possibility allows further relaxing the constraints resulting from the interposer manufacturing process and particularly to the PCB technology.

Moreover, the probe card according to the embodiments of the invention also operates properly in presence of operation temperatures causing thermal expansion of the elements composing it, thus overcoming the drawbacks of the probes currently on the market.

From the foregoing it will be appreciated that, although specific embodiments of the invention have been described herein for purposes of illustration, various modifications may be made without deviating from the spirit and scope of the invention.

We claim:

1. A probe card for a testing apparatus of electronic devices, comprising:
   at least one testing head which houses a plurality of contact probes, each contact probe having at least a contact tip suitable to abut onto a respective one of a plurality of contact pads of a device under test,
   a support plate configured to support the testing head,
   a stiffener associated with the support plate,
   an intermediate support connected to the support plate, the intermediate support being suitable to provide a spatial transformation of distances between contact pads on opposite faces of the intermediate support;
   a support element joined with the intermediate support, the support element being realized by a material having a stiffness greater than the intermediate support and the support element and the intermediate support together being able to realize local micro rectifications of the intermediate support; and
   a regulation system able to associate the stiffener and the support element, apply to the support element local forces pushing and/or pulling the support element with respect to the stiffener, and transmit the local forces to the intermediate support which is joined with the supporting element, wherein:
   the regulation system comprises a plurality of adjustment screws distributed on a plane of the support element and housed in respective seats formed in the stiffener; and
   the plurality of adjustment screws includes first adjustment screws housed in first seats formed in the stiffener in such a way that each first adjustment screw has a body housed in the support element and a head with at least one undercut plane resting on the support element and a flat plane, opposite to the undercut plane, accessible through a respective first seat for adjustment of the first adjustment screw, the first adjustment screws acting by pushing onto the support element.

2. The probe card of claim 1, wherein the support element is glued to the intermediate support.

3. The probe card of claim 1, wherein the support element is a metal plug.

4. The probe card of claim 1, wherein the plurality of adjustment screws further comprises second adjustment screws housed in second seats formed in said stiffener in such a way that each second adjustment screw has a body housed in the support element and a head with at least one undercut plane resting on the stiffener and a flat plane, opposite to the undercut plane, accessible through a respective second seat for adjustment of the second adjustment screw, the second adjustment screws acting by pulling the element support in contrast with a pushing onto the stiffener.

5. The probe card of claim 4, wherein the adjustment screws are realized by substantially tubular elements and have a body with a diameter between 2 mm and 4 mm and a head with a diameter between 4 mm and 7 mm, these values being intended under normal operating conditions for the probe card, i.e. in the absence of mechanical stresses and/or thermal expansion of the same.

6. The probe card of claim 5, wherein the seats of the adjustment screws are realized by substantially tubular elements and comprise at least one housing compartment having a conjugated and complementary shape with respect to the heads of the adjustment screws and an elongate passage.

7. The probe card of claim 1, wherein the regulation system further comprises support screws positioned substantially in a center and at corners of the element support and used to suitably tilt the support element.

8. A probe card for a testing apparatus of electronic devices, comprising:
   at least one testing head which houses a plurality of contact probes, each contact probe having at least a contact tip suitable to abut onto the contact pads of a device under test,
   a support plate of the testing head,
   a stiffener associated with the support plate,
   an intermediate support, connected to the support plate, the intermediate support being suitable to provide a spatial transformation of distances between contact pads on opposite faces of the intermediate support;

a support element joined with the intermediate support, the support element being realized by a material having a stiffness greater than the intermediate support; and a regulation system able to associate the stiffener and the support element and able to apply to the support element local forces pushing and/or pulling the support element with respect to the stiffener, and transmit the local forces to the intermediate support which is joined with the supporting element, wherein:

the regulation system comprises a plurality of adjustment screws distributed on a plane of the support element and housed in respective seats formed in the stiffener so as to realize local micro rectifications of the intermediate support; and the plurality of adjustment screws includes first adjusting screws housed in first seats formed in the stiffener in such a way that each first adjustment screw has a body housed in the support element and a head with at least one undercut plane resting on the support element and a flat plane, opposite to the undercut plane, accessible through a respective first seat for adjustment of the first adjustment screw, the first adjustment screws acting by pushing onto the support element.

9. The probe card of claim 8, wherein the support element is glued to the intermediate support.

10. The probe card of claim 8, wherein the support element is a metal plug.

11. The probe card of claim 8, wherein the plurality of adjustment screws includes second adjustment screws housed in second seats formed in said stiffener in such a way that each second adjustment screw has a body housed in the support element and a head with at least one undercut plane resting on the stiffener and a flat plane, opposite to the undercut plane, accessible through a respective second seat for adjustment of the second adjustment screw, the second adjustment screws acting by pulling the element support in contrast with a pushing onto the stiffener.

12. The probe card of claim 8, wherein the adjustment screws are realized by substantially tubular elements and have a body with a diameter between 2 mm and 4 mm and a head with a diameter between 4 mm and 7 mm, these values being intended under normal operating conditions for the probe card, i.e. in the absence of mechanical stresses and/or thermal expansion of the same.

13. The probe card of claim 12, wherein the seats of the adjustment screws are realized by substantially tubular elements and comprise at least one housing compartment having a conjugated and complementary shape with respect to the heads of the adjustment screws and an elongate passage.

14. The probe card of claim 8, wherein the regulation system further comprises support screws positioned substantially in a center and at corners of the element support and used to suitably tilt the support element.

* * * * *